United States Patent
Eldredge et al.

(10) Patent No.: US 9,128,869 B2
(45) Date of Patent: Sep. 8, 2015

(54) SYSTEMS AND METHODS INVOLVING MANAGING A PROBLEMATIC MEMORY CELL

(75) Inventors: Kenneth James Eldredge, Boise, ID (US); Larry Joseph Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 13/248,221

(22) Filed: Sep. 29, 2011

(65) Prior Publication Data

US 2013/0086453 A1     Apr. 4, 2013

(51) Int. Cl.
| | |
|---|---|
| G06F 11/00 | (2006.01) |
| G11C 7/00 | (2006.01) |
| G11C 11/00 | (2006.01) |
| G06F 11/10 | (2006.01) |
| G11C 29/50 | (2006.01) |
| G11C 11/56 | (2006.01) |
| G11C 13/00 | (2006.01) |

(52) U.S. Cl.
CPC ...... *G06F 11/1048* (2013.01); *G11C 29/50008* (2013.01); *G11C 11/5678* (2013.01); *G11C 13/0004* (2013.01)

(58) Field of Classification Search
None
See application file for complete search history.

(56) References Cited

U.S. PATENT DOCUMENTS

| | | | | |
|---|---|---|---|---|
| 4,345,328 | A * | 8/1982 | White | 714/758 |
| 7,191,379 | B2 * | 3/2007 | Adelmann et al. | 714/758 |
| 7,504,675 | B2 | 3/2009 | Wicker et al. | |
| 8,331,168 | B2 * | 12/2012 | Elfadel et al. | 365/189.14 |
| 2003/0023911 | A1 * | 1/2003 | Davis et al. | 714/723 |
| 2005/0013182 | A1 * | 1/2005 | Smith et al. | 365/201 |
| 2005/0122767 | A1 * | 6/2005 | Perner et al. | 365/158 |
| 2008/0184086 | A1 * | 7/2008 | Kim et al. | 714/746 |
| 2008/0259676 | A1 * | 10/2008 | Ruf et al. | 365/163 |
| 2009/0109737 | A1 | 4/2009 | Kostylev | |
| 2009/0259896 | A1 * | 10/2009 | Hsu et al. | 714/723 |
| 2011/0019791 | A1 * | 1/2011 | Mueller | 378/8 |
| 2011/0038195 | A1 | 2/2011 | Hamilton et al. | |
| 2011/0051508 | A1 | 3/2011 | Eleftheriou et al. | |
| 2011/0055660 | A1 * | 3/2011 | Dudeck et al. | 714/763 |
| 2011/0211391 | A1 * | 9/2011 | Parkinson | 365/163 |

(Continued)

OTHER PUBLICATIONS

Ipek, E., Condit, J., Nightingale, E. B., Burger, D., & Moscibroda, T. (Mar. 2010). Dynamically replicated memory: building reliable systems from nanoscale resistive memories. In ACM SIGARCH Computer Architecture News(vol. 38, No. 1, pp. 3-14). ACM.*

(Continued)

*Primary Examiner* — Justin R Knapp
(74) *Attorney, Agent, or Firm* — Knobbe, Martens, Olson & Bear, LLP

(57) ABSTRACT

Methods and apparatus are provided for identifying which symbol within a codeword corresponds to an information state read from a problematic memory cell. A method can include applying a programming signal to a memory cell, and determining whether the programming signal programs the memory cell approximately within an operational range of a physical property of the memory cell. The method can include identifying which symbol within a codeword corresponds to an information state read from the memory cell, if the memory cell was not programmed approximately within the operational range of the physical property. Identifying the symbol can be done with a flag in the codeword.

22 Claims, 4 Drawing Sheets

(56) References Cited

U.S. PATENT DOCUMENTS

| | | | |
|---|---|---|---|
| 2012/0069622 A1* | 3/2012 | Parkinson et al. | 365/145 |
| 2012/0290899 A1* | 11/2012 | Cideciyan et al. | 714/773 |
| 2013/0021838 A1* | 1/2013 | Tomotani et al. | 365/148 |

OTHER PUBLICATIONS

Pronin, Alexander, Phase Change Memory: Fundamentals and Measurement Techniques, www.keithley.com/data?asset=53267, Mar. 2010.*

Lai, S., "Current status of the phase change memory and its future," Electron Devices Meeting, 2003. IEDM '03 Technical Digest. IEEE International, vol., no., pp. 10.1.1,10.1.4, Dec. 8-10, 2003 doi: 10.1109/IEDM.2003.1269271.*

Seong, et al, "SAFER: Stuck-At-Fault Error Recovery for Memories," Microarchitecture (MICRO), 2010 43rd Annual IEEE/ACM International Symposium on, Dec. 4-8, 2010, Atlanta, GA, pp. 115-124.

* cited by examiner

SYSTEMS AND METHODS INVOLVING MANAGING A PROBLEMATIC MEMORY CELL

BACKGROUND

Certain types of memory cells, such as phase change memory cells, may store information as a function of a resistance or another physical (e.g., acoustic, electrical, magnetic, or optical) property that is capable of being directly or indirectly determined. Under certain circumstances, it may not be possible to program a memory cell correctly (e.g., it may not be possible, at least temporarily, to program a property of the memory cell to one or more particular states), in which case the memory cell may be considered to be "problematic." The inability to program the property to one or more particular states may be permanent or temporary.

BRIEF DESCRIPTION OF THE DRAWINGS

Embodiments of claimed subject matter are illustrated by way of example and not by way of limitation in the figures of the accompanying drawings, in which:

DESCRIPTION OF EMBODIMENTS

Figure 1:
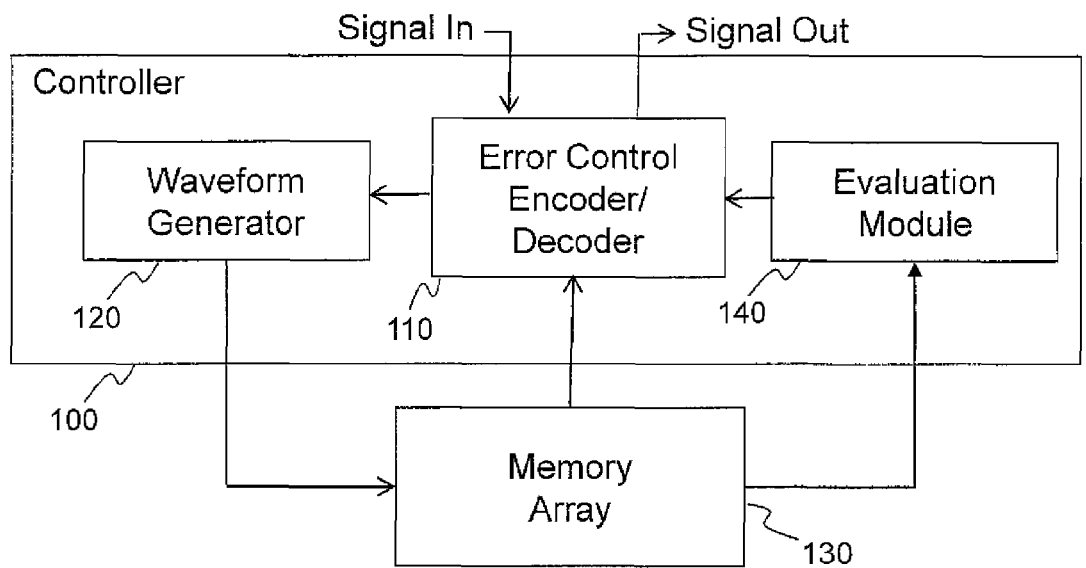
FIG. 1 shows a portion of a system according to various embodiments of claimed subject matter.

In the following detailed description, reference is made to the accompanying figures that show, by way of illustration, specific embodiments of claimed subject matter. These embodiments are described in sufficient detail to enable those skilled in the art to practice claimed subject matter. It is to be understood that the various embodiments of claimed subject matter, although different, are not necessarily mutually exclusive. For example, a particular feature, structure, or characteristic described herein in connection with one embodiment may be implemented within other embodiments of claimed subject matter. In addition, it is to be understood that the location or arrangement of individual elements within a disclosed embodiment may be modified. The following detailed description is, therefore, not to be taken in a limiting sense, and subject matter for the present application is determined only by the issued claims, appropriately interpreted, along with the full range of equivalents to which the claims are entitled. In the drawings, like numerals refer to the same or similar functionality throughout the several views.

Some portions of the following description are presented in terms of logic, algorithms, or symbolic representations of operations on information stored within a memory (e.g., bits of data) of a system, such as a specific apparatus or special-purpose computing device or platform. In the context of the specification, the term "specific system" or the like includes a general-purpose computer once it is programmed to perform particular functions pursuant to instructions from program software. Algorithmic descriptions or symbolic representations are examples of techniques used by those of ordinary skill in the art in the data processing or related arts to convey the substance of their work to others skilled in the art. An algorithm is here, and generally, considered to be a self-consistent sequence of operations or similar processing leading to a desired result. In this context, operations or processing involve manipulation of physical properties. Manipulation includes a change in a physical property of a memory cell such that the memory cell is to be programmed to a particular information state (e.g., a state representing a logic "1" or a state representing a logic "0"). Manipulation also includes a change in a physical property of an information signal (e.g., an acoustic, electrical, magnetic, or optical signal) used to combine, communicate, compare, store, transform or otherwise manipulate the information state(s) to be programmed into or read from one or more memory cells. It has proven convenient at times, principally for reasons of common usage, to refer to information signals and/or such information states as bits, data, values, elements, symbols, characters, terms, numbers, numerals, or the like. It should be understood, however, that all of these or similar terms are to be associated with the appropriate physical properties, and corresponding measurements thereof and are merely convenient labels. Unless stated otherwise, as apparent from the following discussion, it is appreciated that throughout the specification, discussions utilizing terms such as "processing," "computing," "determining," "detecting," "flagging," "designating," "setting," "assigning," "generating," or the like may refer to actions or processes of a system (e.g., a specific apparatus, such as a special purpose computer or similar special-purpose electronic computing device). In the context of this specification, therefore, a special-purpose computer or a similar special-purpose electronic computing device is capable of manipulating information signals or information states.

Embodiments of claimed subject matter may include methods and/or systems (e.g., an individual apparatus or a combination of apparatuses or components thereof) for performing operations. A system may be specially constructed for desired purposes, or a system may comprise a general-purpose computing device capable of operating in accordance with a computer program stored in memory. A program may be stored on a storage medium, such as, but not limited to, any type of disk including floppy disks, optical disks, compact disc read only memories (CD-ROMs), magnetic-optical disks, read-only memories (ROMs), random access memories (RAMs), non-volatile memories such as electrically programmable read-only memories (EPROMs), electrically erasable and programmable read only memories (EEPROMs), or FLASH memories, phase change memories (PCM), or any other type of media suitable for storing electronic instructions.

In describing embodiments of claimed subject matter, the term "bit" corresponds to a state of a binary digital information signal sometimes also referred to as a logic signal or logic state. The value of a bit may be stored by programming a memory cell to a first (e.g., logic 1) information state or a second (e.g., logic 0) information state. Additionally, multiple binary digital information signals or multiple information states comprising individual binary digital information signals or states may be organized or aggregated to construct (e.g., assemble) a "symbol," which may collectively represent, for example, two bits, four bits, eight bits, 10 bits, and so forth (however, a symbol need not be so limited, as a symbol can also represent, for example, a single bit). In one example, a 2-bit symbol may have a value of 00, 01, 10, or 11. In some cases, a single memory cell may be selectively programmed to a respective information state representing any one of those values. For example, a 00 value of a 2-bit symbol may be stored by programming a memory cell to a respective one of four possible information states corresponding to a measurable voltage level. In a similar manner, a particular value of a 4-bit symbol (e.g., 0101) may be stored by programming one or more memory cells to a respective one of 16 possible information states, and a particular value of an 8-bit symbol (e.g., 0000 0110) may be stored by programming one or more memory cells to a respective one of 256 different information states, and so forth. Any of the foregoing symbols may be communicated as one or more measurable physical properties (e.g., an acoustic, current, radiation, or voltage level) of one or more information signals.

Further, a "codeword" may be constructed from one or more symbols (perhaps as many as 200 or more) along with, for example, error control bits which may be used to detect and/or correct errors introduced through various mechanisms or approaches. Embodiments of claimed subject matter may include an erasure flag that indicates that location(s) of one or more errors within a codeword is or are known or can at least be approximated. In the event that location(s) of one or more errors within a codeword are known or can at least be approximated, certain error control codes (such as, for example, a Reed Solomon error control code) may be capable of correcting perhaps as many as twice the number of errors that could be corrected if the location(s) of the one or more errors was or were otherwise unknown (although nothing herein should be interpreted as requiring or limiting embodiments of claimed subject matter to a particular error control coding technique).

Use of the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicate that two or more elements are in direct or indirect (with other intervening elements between them) physical or electrical contact with each other, or that the two or more elements cooperate or interact with each other.

As it pertains to particular embodiments of claimed subject matter, such as embodiments that make use of memory cells in which a cell may be capable of storing a single bit or multiple bits of information as a particular phase of a memory material, a system may include a memory array and a controller (e.g., a separate memory controller or control circuitry integrated with a memory array). In an embodiment, a controller may be capable of managing (e.g., identifying, designating, flagging, etc.) one or more problematic memory cells of an array, for example. A memory cell may be determined to be problematic if, for example, the state of the memory cell approximates a short circuit or approximates an open circuit. In an embodiment, an approximate short circuit may exist if the resistance across nodes (e.g., contacts, terminals, etc.) of a memory cell exhibits less than, for example, 1 K ohm. An approximate open circuit may exist if the resistance across the nodes exhibits greater than, for example, 100 K ohm. However, claimed subject matter is not limited in this respect.

In an embodiment, a controller may be capable of applying (e.g., conveying) a pulse, waveform or other signal having a variable voltage, a variable current, a variable duration, or any combination thereof, which may function to program memory cells typically by varying in signal level. A memory controller may also be capable of identifying the memory cell as problematic if, after applying a series of cell programming and/or erasure signals (e.g., a series of programming pulses and/or erasure signals) to a memory cell, the memory cell continues to approximate short circuit or an open circuit. A controller may be capable of applying a Reed Solomon error control code to a codeword, wherein the codeword includes a symbol corresponding to one or more information states read from one or more a memory cell(s), wherein at least one cell may be identified as problematic and managed accordingly.

A system that accords with embodiments of claimed subject matter, which may be implemented in a solid-state drive, may include an array of memory cells coupled to a controller. A controller may capable of determining whether a memory cell within an array of memory cells is programmed or capable of being programmed within an operational range of a measurable physical property of the memory cell (e.g., it may determine whether the memory cell approximates a short circuit or approximates an open circuit after attempted or repeated programming). An operational range may include a first portion corresponding to a first information state (e.g., representing a logical 0) and a second portion corresponding to a second information state (e.g., corresponding to a logical 1). In another embodiment, perhaps in which a memory cell is capable of being programmed to a selected one of more than two information states (e.g., to represent more than a single bit of information, such as two bits of information), an operational range may additionally include, for example, third and fourth portions (e.g., where individual information states may represent a respective one of 11, 01, 10, and 00). In other embodiments of claimed subject matter, an operational range may include more than four portions, such as to correspond to more than four information states. A controller may provide (e.g., assign or generate) a flag (e.g., an erasure flag) to identify a symbol of a codeword that corresponds to an information state read from a memory cell that was not programmed within the operational range (e.g., corresponding to an information state read from a problematic memory cell).

FIG. 1 shows a system (or portions thereof) according to embodiments of claimed subject matter. Elements of FIG. 1 may be included within, for example, a computer, external memory storage unit, or a mobile phone with nonvolatile memory. In another example, elements of FIG. 1 may be found within a global positioning system (GPS) receiver or a media player having nonvolatile memory although claimed subject matter is not limited in this respect.

In FIG. 1, controller 100 may receive an input information signal and may encode the signal using error control encoder/decoder 110. Encoded information signals may be converted to one or more programming signals using waveform generator 120. Programming signals, which may comprise electrical pulses having variable voltage levels, variable current levels, variable durations, or any combination thereof, may be addressed and applied to specific memory cells within memory array 130. Memory array 130 may include a two-dimensional array of phase change memory cells in which information states may be stored in a memory cell by bringing about a phase change of a memory material from a high resistance state to a low resistance state. In one embodiment, a high resistance state of a memory material may correspond to an amorphous condition in which a relatively unstructured state of microcrystals within the material may restrict movement of electrons from an input node to an output node of the memory cell. In an embodiment, a low resistance state of a memory material may correspond to a crystalline state in which a relatively structured arrangement of microcrystals within the material permits movement of electrons more easily from an input node to an output node of a memory cell.

In an embodiment of claimed subject matter, which will be further illustrated with reference to FIG. 4, phase change memory cells of memory array 130 may exhibit various levels of resistance between input and output nodes as a function of a degree to which a memory material that lies between input and output contacts can be manipulated to a variety of levels between amorphous (high resistance) and crystalline (low resistance) states. A resistance that approximates a short circuit, for example, less than 1 K ohm, may indicate a predominantly crystalline state of a memory material. A resistance that approximates an open circuit, for example, greater than 100 K ohm, may indicate a predominantly amorphous state of a memory material. An operational range between an approximate short circuit and an approximate open circuit may correspond to various information states of a memory cell. In one example that may employ a memory cell capable of being programmed to a selected one of two information states (e.g., representing a single bit of information), a resistance of between 1 K ohm and 50 K ohm, for example, may represent a logical 0, while a resistance of between 50 K ohm and 100 K ohm, for example, may represent a logical 1 (although, as understood by one of ordinary skill in the art, the representation of a particular logical value by a particular information state may be a matter of design choice).

In another example, in which a memory cell within memory array 130 may be programmed to a selected one of more than two information states (e.g., to represent more than a single bit of information), an operational range of between 1 K ohm and 100 K ohm, for example, may be divided into more than two portions (e.g., 16 sub-ranges of resistances, thereby being capable of storing four binary digits of information). In an example, a memory cell having a resistance below 1K ohm, such as an approximate short circuit, or a resistance above 100 K ohm, such as an approximate open circuit, may be problematic. Outlying values, such as the foregoing, for example, may be used to identify a memory cell as problematic, or to identify a symbol of a codeword that corresponds to an information state read from a problematic memory cell (e.g., with an erasure flag in a codeword in a possible embodiment). A codeword that includes an erasure flag may be used by an error control decoder, such as a Reed Solomon decoder, capable of correcting codewords having erasure flags output from memory array 130.

To bring about storage of an information state within memory array 130, for example, waveform generator 120 may apply one or more programming signals, which may include one or more electrical pulses, for example, to various memory cells within memory array 130. Responsive to applying the programming signal to a memory cell within memory array 130, evaluation module 140, for example, may determine a resistance (or another physical property) for the programmed memory cells within memory array 130. In the event that a memory cell does not have a resistance within an operational range, a subsequent programming signal from waveform generator 120 may be iteratively adjusted within a given time window, to attempt to bring that memory cell to a resistance in the operational range. In an embodiment of claimed subject matter, in which memory cells within memory array 130 are phase change memory cells, if evaluation module 140 detects that a resistance is too low, approximating a short circuit, for example, a programming signal may be applied to a memory cell that may function to melt a portion of a memory material between input and output nodes of that memory cell, thereby increasing resistance of the memory material. If evaluation module 140 detects that a resistance is too high, approximating an open circuit, a programming signal may be applied to that memory cell that may function to anneal a portion of the memory material, thereby reducing resistance of the material.

In the event that iteratively applying programming signals within a given time window, does not result in a particular memory cell having a measurable resistance that is within an operational range, evaluation module 140 may signal error control encoder/decoder 110 to identify that particular memory cell, or to identify (whether directly or indirectly, such as by approximation) a symbol including the information state read from that particular memory cell, as being problematic. As previously mentioned, problematic memory cells/symbols, in a possible embodiment, may be identified and managed by way of an erasure flag. In one embodiment, for example, error control encoder/decoder 110 may include a Reed Solomon decoder, which may generate a codeword having an erasure flag. An erasure flag may be used to identify a symbol within the codeword that includes an information state read from a problematic memory cell.

In an embodiment in which error control encoder/decoder 110 employs a Reed Solomon technique, encoder/decoder 110 may apply additional error control functions. These may include error location polynomial construction, syndrome determination, and so forth. Further, in the event that a portion of memory array 130 (e.g., a sector, block, and so on) includes problematic memory cells too numerous to allow assembling of information states read from problematic cells into codewords, encoder/decoder 110 may declare the portion of memory array 130 as problematic. In this instance, memory operations involving the problematic portion of array 130 may be suspended.

Figure 2:
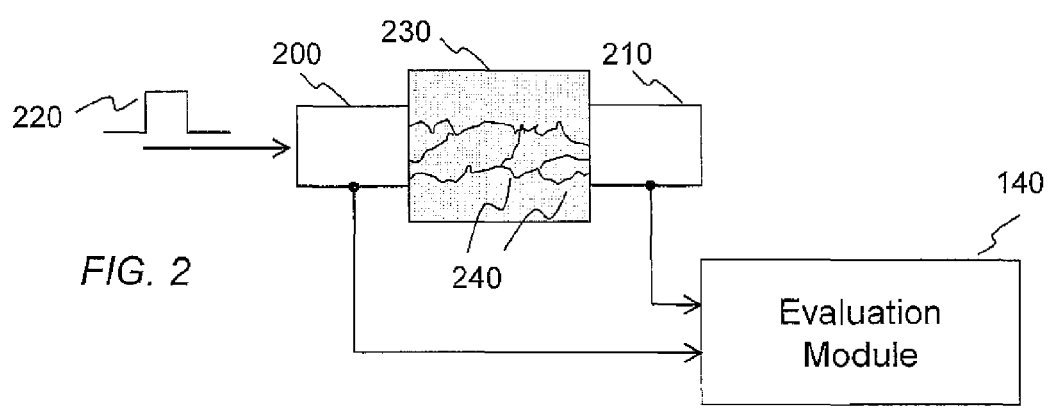
FIG. 2 shows programming signals and an effect of programming signals on a memory material according to various embodiments of claimed subject matter.

FIG. 2 shows a programming signal and an effect of programming signals on a memory material according to embodiments of claimed subject matter. In FIG. 2, programming signal 220 may be applied to input node 200. As previously mentioned, programming signals may be iteratively applied within a given time window to bring about an increased resistance or a decreased resistance of memory material 230 which lies between input node 200 and output node 210. In an embodiment of claimed subject matter in which memory material 230 includes a phase change material, to increase resistance exhibited between input node 200 and output node 210, a programming signal 220 having a short duration but a relatively high voltage or high current amplitude may be used. To decrease resistance between input node 200 and output node 210, a programming signal having a relatively low voltage or low current amplitude but having a longer duration may be used. Of course, this is but one partial approach toward programming memory cells and claimed subject matter is not limited in this respect.

In FIG. 2, memory material 230 is shown as having dendrites 240, which extend from an edge of input node 200 to an edge of output node 210. Dendrites 240 represent microcrystalline strands of increased conductivity, which may be grown or annealed by way of a programming signal having a lower voltage and current, but perhaps a relatively long duration. In this manner, an application of a series of programming pulses may function to increase the number and/or breadth of dendrites 240, thereby decreasing resistance measured between input node 200 and output node 210. In contrast, resistance measured between input node 200 and output node 210 may be increased by way of a higher voltage and/or current programming signal of perhaps shorter duration, which may function to melt portions of memory material 230, thereby increasing randomization of microcrystalline strands that form dendrites 240. Randomization may decrease the number of dendrites 240.

Figure 3:
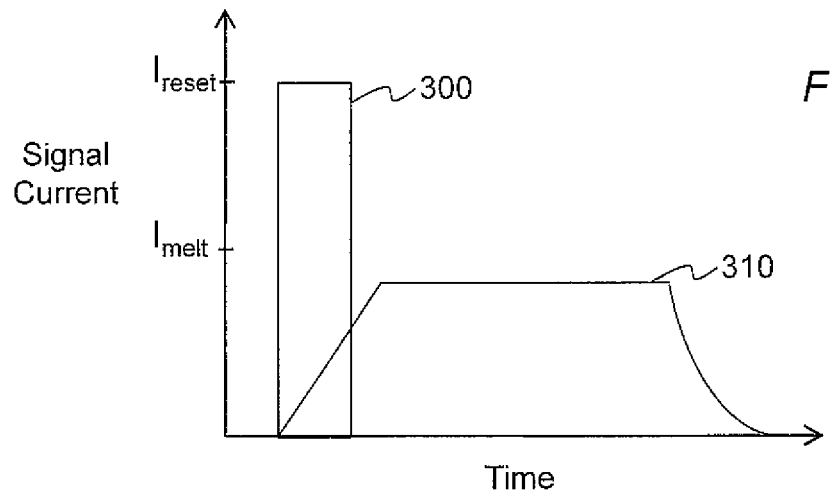
FIG. 3 shows additional programming signals which may be used according to various embodiments of claimed subject matter.

FIG. 3 shows waveforms that may be used as programming signals according to various embodiments of claimed subject matter. In FIG. 3, programming signal 300 may be used to melt memory material 230 of FIG. 2. As shown in FIG. 3, programming signal 300 may be of a relatively short duration and have amplitude at or near a value of $I_{reset}$, wherein $I_{reset}$ corresponds to a current greater than that used to melt memory material 230. FIG. 3 also includes a programming signal 310, which may be of a comparatively longer duration than programming signal 300 but has amplitude lower than $I_{melt}$, wherein $I_{melt}$ corresponds to a current less than that used to melt memory material 230. Programming signal 310 may be used to anneal memory material 230, in one embodiment, for example.

Amplitude of programming signals 300 and/or 310 may be adjusted upward or downward in response to a resistance measurement by evaluation module 140 of FIGS. 1 and 2. For example, in the event that a resistance measured between input node 200 and output node 210 indicates that resistance should be increased by a relatively small amount in order to obtain a desired information state, a subsequent programming signal may have amplitude that is a relatively small amount greater than $I_{melt}$, in one embodiment. In another embodiment, in the event that a resistance measured between input node 200 and output node 210 indicates that resistance should be decreased by a relatively small amount, a subsequent programming signal may have amplitude less than $I_{melt}$ and/or may perhaps be of a shorter duration than programming signal 310.

Accordingly, memory cells that have resistances outside of an operational range may, in some instances, be gradually altered by way of one or more subsequent programming signals. Thus, in one possible embodiment, applying a sufficient number of programming signals, which may alternate between melting and annealing of memory material over a given time window, may result in a memory cell having a measurable resistance within the operational range.

Figure 4:
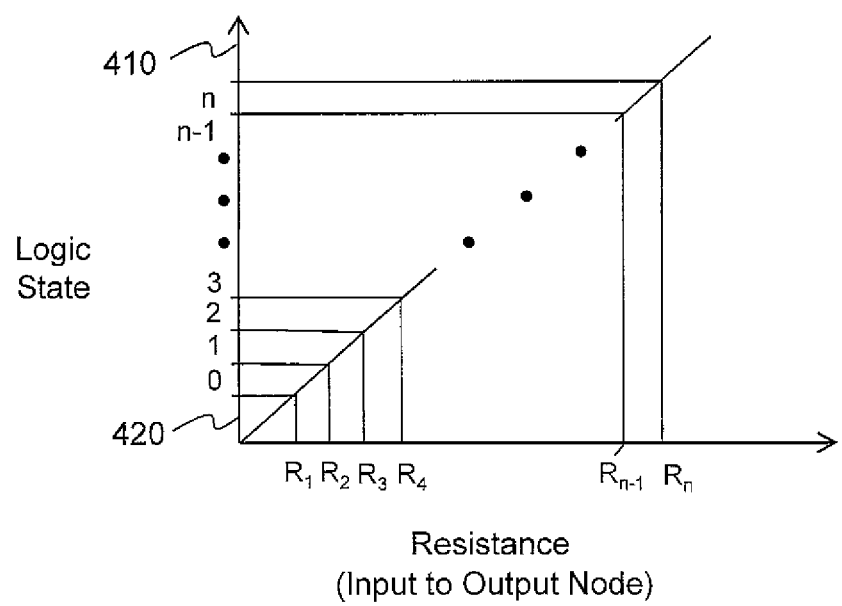
FIG. 4 shows information states of a memory cell according to various embodiments of claimed subject matter.

FIG. 4 shows states of a memory cell. In FIG. 4, resistances that may be measured from an input node to an output node of a memory cell are shown on the horizontal axis. The vertical axis of FIG. 4 includes information states within an operational range. A first portion of the operational resistance range (e.g., between $R_1$ and $R_2$) may correspond to a first information state (e.g., logic state 0). A second portion of the operational resistance range (e.g., between $R_2$ and $R_3$) may correspond to a second information state (e.g., logic state 1). A third portion of the operational resistance range (e.g., between $R_3$ and $R_4$) may correspond to a third information state (e.g., representing logic state 2), and so forth. For example, the portion of the operational resistance range at the right-hand end of the horizontal axis of FIG. 4 (e.g., between $R_{n-1}$ to $R_n$) may correspond to a n−1th information state (e.g., representing logic state "n−2").

In FIG. 4, states 410 and 420 may correspond to upper and lower outlying resistance ranges, respectively. These regions may indicate problematic memory cell states, which may correspond to resistance ranges lying outside of an operational range of resistances. Thus, for example, state 420 may correspond to a resistance below $R_1$ (e.g., less than 1 K ohm), thereby approximating a short circuit. State 410 may correspond to a resistance above $R_n$ (e.g., greater than 100 K ohm), thereby approximating an open circuit. In the embodiment of FIG. 4, memory cells that have resistances outside of an operational range, such as those having a resistance corresponding to state 410 or state 420, may be identified and managed using erasure flags. Erasure flags may, for example, be used to indicate to an error control decoder that an error may be present at a particular memory cell or within a symbol that includes an information state read from a problematic memory cell.

In an embodiment similar to that of FIG. 4, a memory cell may store a single bit by being programmed to a selected one of two possible information states, in contrast to a memory cell that may store more than one bit, such as discussed in relation to FIG. 4. In a single-bit cell, a first relatively broad portion of an operational resistance range may correspond to a first information state (e.g., representing a logic state 0), while a second relatively broad portion of an operational resistance range may correspond to a second information state (e.g., representing a logic state 1). In an embodiment, a resistance measured to be lower than the first portion or higher than the second portion may result in an evaluation module identifying a symbol including an information state read from a problematic memory cell with an erasure flag in a codeword that includes the symbol.

In another possible embodiment, a problematic memory cell that cannot be programmed to a desired value within an operational range may, in some instances, be capable of being programmed to an outlying value. For example, after attempting to iteratively adjust a programming signal to bring a memory cell to a desired state within a predetermined time window, programming signal current may be adjusted upward, which may, at least in part, result in a memory cell exhibiting an approximate open circuit. In some embodiments, detecting an approximate open circuit may represent a simple technique of tracking problematic memory cell locations.

Figure 5:
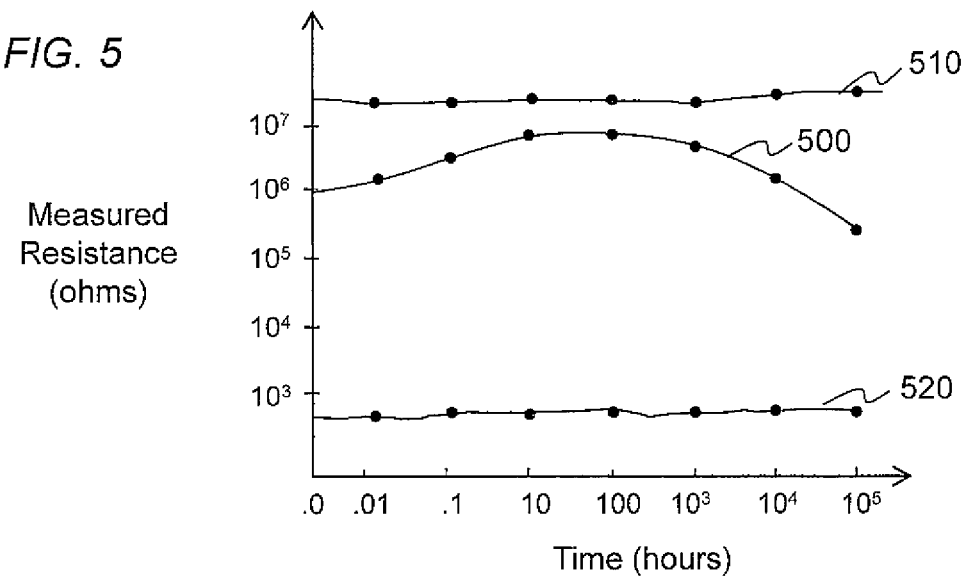
FIG. 5 shows an example of a resistance measured across nodes of a memory cell as a function of time according to various embodiments of claimed subject matter.

FIG. 5 shows an example of a resistance measured across nodes of a memory cell as a function of time. As can be seen in at resistance profile 500 of FIG. 5, a memory cell, which may have a resistance of $10^6$ ohms at a time t=0, may have a resistance closer to $10^7$ ohms approximately 10 hours later. After approximately 100 hours, the resistance of the memory cell may begin to decrease. At approximately $10^5$ hours, resistance exhibited by a memory cell may decrease beyond a value of $10^6$ ohms measured at t=0 to a value that approaches $10^5$ ohms. Thus, from resistance profile at 500 of FIG. 5 it can be seen that even without further programming, such as using programming signal 310 of FIG. 3, for example, memory cells having resistances outside an operational range may potentially return to the operational range after a period of time, in some instances.

FIG. 5 also shows resistance profiles 510 and 520, which may indicate resistances from outside operational ranges as a function of time. Resistance profile 510 shows resistance of a memory cell above an operational range, which may be, for example, $10^7$ ohms. As a function of time, resistance exhibited by the memory cell remains relatively constant. At resistance profile 520, a resistance of a memory cell below an operational range, which, in an example, may be $10^3$ ohms. In a manner similar to that of resistance profile 510, resistance profile 520 maintains a relatively constant resistance as a function of time.

Figure 6:
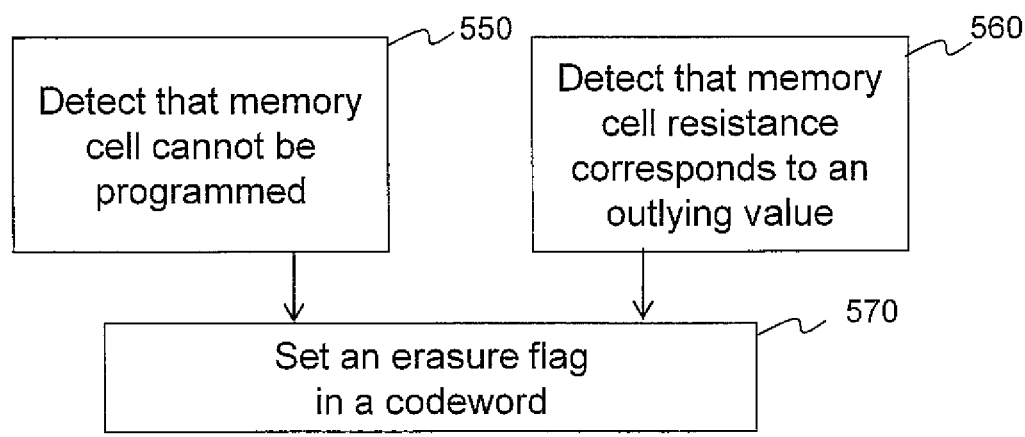
FIG. 6 shows a method of setting an erasure flag in a codeword according to embodiments of claimed subject matter.

FIG. 6 shows a method of managing a problematic memory cell. In some embodiments, the system of FIG. 1 may be suitable for performing the method of FIG. 6, although nothing prevents performing the method of FIG. 6 using alternate arrangements of components in other embodiments. Embodiments may include blocks in addition to those shown and described in FIG. 6, fewer blocks than those shown and described in FIG. 6, blocks occurring in a different order than those shown and described in FIG. 6, or any combination thereof.

In an implementation, a memory cell may exhibit at least two states that may result, at least in part, in block 570 being performed, in which an erasure flag is set in a codeword. At block 550, which may comprise a first condition, a memory cell that cannot be programmed, at least within a particular time window, for example, is detected. In an implementation, a memory cell may exhibit a resistance or other electrical property that cannot be manipulated to program the memory cell. Thus, in one example, iteratively adjusting a programming waveform over a specified time window may fail to result in changing a state of a memory cell to an operational resistance range. This may result, at least in part, in block 570 in which an erasure flag may be set in a codeword.

At block 560, which may comprise a second condition that may result in block 570 being performed, a memory cell that exhibits an outlying resistance range may result, at least in part, in setting a codeword with an erasure flag. In an implementation, a memory cell that exhibits a resistance that cannot be adjusted to exhibit an electrical property, such as resistance in an operational range may result, at least in part, in setting an erasure flag in a codeword.

In one possible embodiment, detecting a memory cell that cannot be programmed within a given time window, as in block 550, for example, may result in storing the location of a problematic cell in a table stored in a nonvolatile memory. The table of problematic memory cells may be used during a power up sequence of a memory device so that locations of problematic cells may be tracked. Additionally, in some instances a problematic memory cell may be capable of being assigned to an outlying value, as in block 560, for example. In this instance, detecting an approximate open or approximate short circuit may result in a method of identifying and/or managing problematic memory cell locations in a manner that does not include the use of a problematic cell table.

Figure 7:
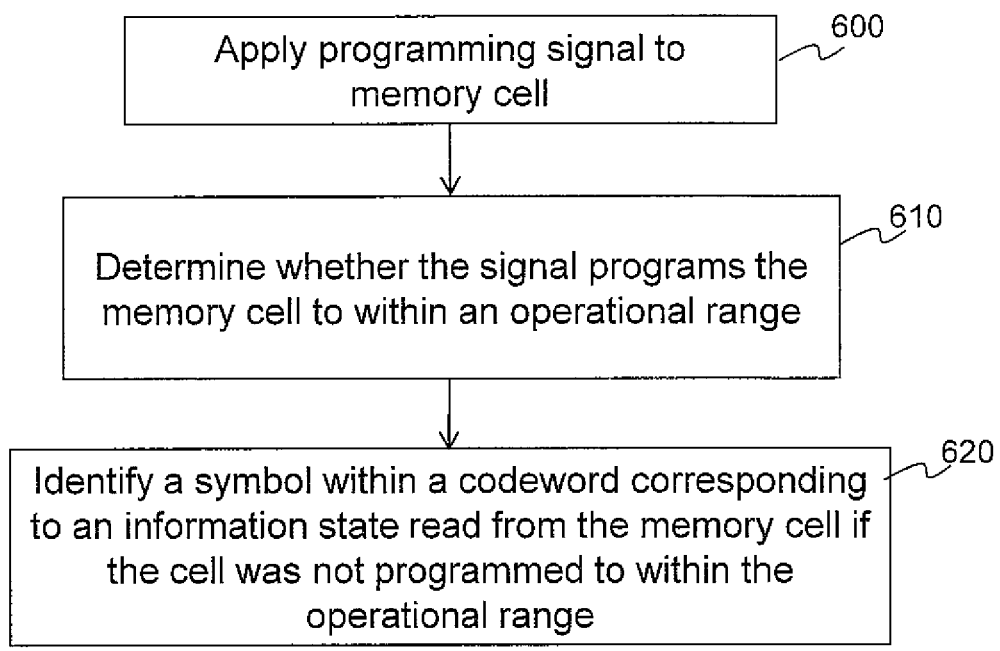
FIG. 7 shows a method of managing a problematic memory cell according various to embodiments of claimed subject matter.

FIG. 7 shows a method of managing a problematic memory cell. In some embodiments, the system of FIG. 1 may be suitable for performing the method of FIG. 6, although nothing prevents performing the method of FIG. 7 using alternate arrangements of components in other embodiments. Embodiments may include blocks in addition to those shown and described in FIG. 7, fewer blocks than those shown and described in FIG. 7, blocks occurring in a different order than those shown and described in FIG. 7, or any combination thereof.

In one embodiment, a method may begin at block 600 in which a programming signal is applied to a memory cell. A memory cell to which the programming signal is applied may be capable of storing a single bit (e.g., by being programmed to a selected one of two possible information states), or may be capable of storing more than one bit (e.g., by being programmed to a selected one of two or more possible information states). Continuing, block 610 includes determining whether the memory cell is programmed within an operational range. Block 610 may include, for example, measuring an electrical property of the memory cell, such as measuring the resistance between nodes of the memory cell. If it has been determined that a memory cell was not programmed within an operational range, perhaps by detecting that a measured resistance is above or below the operational range, that memory cell may be identified and/or managed with an erasure flag and managed accordingly, as in block 620 in a possible embodiment.

Methodologies described may be implemented by various approaches depending, at least in part, on applications according to particular features or examples. For example, such methodologies may be implemented in hardware, filmware, or combinations thereof, along with software. In a hardware implementation, for example, a processing unit may be implemented within one or more application-specific integrated circuits, digital signal processors, digital signal processing devices, programmable logic devices, field programmable processors, microcontrollers, microprocessors, electronic devices, other devices or units capable of performing the functions described, or combinations thereof.

It will, of course, be understood that, although particular embodiments have just been described, claimed subject matter is not limited to a particular embodiment or implementation. For example, one embodiment may be in hardware, such as implemented in a subsystem or an arrangement of components or devices, for example. Likewise, although claimed subject matter is not limited in this respect, one embodiment may comprise one or more articles, such as a storage medium or storage media that may have stored thereon instructions capable of being executed by a specific or special purpose system or apparatus, for example, to result in performance of an embodiment of a method in accordance with claimed subject matter, such as one of the embodiments previously described, for example. However, claimed subject matter is, of course, not limited to one of the embodiments previously described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited to this example.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the purview of claimed subject matter.

What is claimed is:

1. A method, comprising:
applying a programming signal to a memory cell, wherein the memory cell is configured to store information for at least a portion of a symbol in a codeword;
determining whether the programming signal programs the memory cell approximately within an operational range of a physical property of the memory cell; and
identifying the memory cell as problematic, if the memory cell was not programmed approximately within the operational range of the physical property, and
programming the problematic memory cell to a resistance value outside of the operational range.

2. The method of claim 1, further comprising identifying, with an erasure flag, the memory cell which was not programmed approximately within the operational range of the physical property.

3. The method of claim 1, wherein determining whether the programming signal programs the memory cell approximately within an operational range of a physical property of the memory cell comprises determining an electrical property of the memory cell.

4. The method of claim 3, wherein determining an electrical property of the memory cell comprises measuring a resistance of the memory cell.

5. The method of claim 4, wherein determining whether the programming signal programs the memory cell approximately within an operational range of a physical property of the memory cell comprises determining whether the measured resistance is above the operational range or below the operational range.

6. The method of claim 1, wherein the operational range of the memory cell comprises two information states and the memory cell is capable of storing a single bit of information.

7. The method of claim 1, wherein the operational range of the memory cell comprises more than two information states and is capable of storing multiple bits of information.

8. The method of claim 1, further comprising:
decoding the codeword.

9. A method of managing a problematic memory cell using an error control code, comprising:
determining whether a memory cell is problematic, wherein the memory cell is configured to store information for at least a portion of a symbol in a codeword;
setting a flag if the memory cell is determined to be problematic, wherein the flag identifies the problematic memory cell; and
programming the problematic memory cell to a resistance value outside of an operational range of resistances corresponding to information states.

10. The method of claim 9, wherein determining further comprises:
iteratively applying a programming signal to the memory cell.

11. The method of claim 9, wherein the error control code comprises a Reed Solomon error control code.

12. The method of claim 9, wherein the determining results from
detecting whether the memory cell is approximately open-circuited or approximately short-circuited.

13. The method of claim 9, wherein the determining results from
detecting that the memory cell cannot be programmed to a desired resistance range within an allotted time.

14. A system comprising:
an array of memory cells;
a controller coupled to the array of memory cells, wherein the controller is capable of:
determining whether a memory cell of the array is programmed approximately within an operational range of a physical property of the memory cell, wherein the memory cell is configured to store information for at least a portion of a symbol in a codeword;
providing a flag that identifies the memory cell as problematic, if it is determined that the memory cell was not programmed within the operational range, and
programming the problematic memory cell to a resistance value outside of the operational range.

15. The system of claim 14, wherein the operational range includes a first portion and a second portion.

16. The system of claim 14, wherein the operational range further includes a third portion.

17. The system of claim 14, wherein the operational range lies between an approximate short circuit and an approximate open circuit.

18. The system of claim 17, wherein the memory cell is identified as problematic if a series of programming signals has been applied to the memory cell and the memory cell continues to approximate either the short circuit or the open circuit.

19. The system of claim 14, wherein the system comprises a solid-state drive.

20. The system of claim 14, wherein the memory cell is capable of storing information as a particular phase of a memory material of the memory cell.

21. The system of claim 14, wherein the memory cells are capable of being programmed to a selected one of at least two information states.

22. The system of claim 14, wherein the controller is capable of applying a Reed Solomon error control code to the codeword.

* * * * *